United States Patent

Ikeda et al.

(10) Patent No.: US 7,038,548 B2
(45) Date of Patent: May 2, 2006

(54) AMPLIFIER CIRCUIT FOR AM BROADCASTING

(75) Inventors: Takeshi Ikeda, Tokyo (JP); Hiroshi Miyagi, Kanagawa (JP)

(73) Assignee: Niigata Seimitsu Co., Ltd., Niigatta (JP)

( * ) Notice: Subject to any disclaimer, the term of this patent is extended or adjusted under 35 U.S.C. 154(b) by 118 days.

(21) Appl. No.: 10/708,339

(22) Filed: Feb. 25, 2004

(65) Prior Publication Data

US 2004/0164806 A1 Aug. 26, 2004

Related U.S. Application Data

(63) Continuation of application No. 10/606,964, filed on Jun. 27, 2003, now Pat. No. 6,753,736, which is a continuation of application No. PCT/JP01/11552, filed on Dec. 27, 2001.

(30) Foreign Application Priority Data

Dec. 28, 2000 (JP) .................... 2000-400737

(51) Int. Cl.
*H03F 3/04* (2006.01)

(52) U.S. Cl. .................... 330/305; 330/311
(58) Field of Classification Search ................ 330/305, 330/310, 311, 301
See application file for complete search history.

(56) References Cited

U.S. PATENT DOCUMENTS

| 3,510,788 A | | 5/1970 | Wollesen |
| 4,277,757 A | | 7/1981 | Kennedy |
| 4,409,557 A | * | 10/1983 | Sechi ..................... 330/277 |
| 4,520,324 A | | 5/1985 | Jett et al. |
| 4,590,613 A | | 5/1986 | Tannery |
| 5,339,048 A | * | 8/1994 | Weber ..................... 330/302 |
| 6,417,734 B1 | | 7/2002 | Luo et al. |
| 6,509,799 B1 | * | 1/2003 | Franca-Neto ............. 330/305 |
| 6,636,119 B1 | | 10/2003 | Vathulya |

FOREIGN PATENT DOCUMENTS

| JP | 44-24965 | 10/1969 |
| JP | 60-22904 | 11/1985 |
| JP | 60-229430 | 11/1985 |
| JP | 6-21842 | 1/1994 |
| JP | 6-104783 | 4/1994 |

* cited by examiner

*Primary Examiner*—Henry Choe
(74) *Attorney, Agent, or Firm*—Connolly Bove Lodge & Hutz LLP; Larry J. Hume

(57) ABSTRACT

An amplifier circuit for AM broadcasting for amplifying an inputted AM broadcast signal by an FET and outputting it. The amplifier circuit comprises FETs for signal amplification which are P-channel MOSFETs (4, 5) of relatively small flicker noise. While suppressing the flicker noise to a lowest possible level, more circuits including the RF amplifier for AM broadcasting can be integrated on one chip, thereby realizing small size and low noise of the circuits.

4 Claims, 2 Drawing Sheets

(a) TUNING CIRCUIT FORMAT
(CONVENTIONAL ART)

(b) NON-TUNING CIRCUIT FORMAT
(CONVENTIONAL ART)

AMPLIFIER CIRCUIT FOR AM BROADCASTING

CROSS REFERENCE TO RELATED APPLICATIONS

This Application is a Continuation of application Ser. No. 10/606,964 filed on Jun. 27, 2003, now U.S. Pat. No. 6,753,736. Ser. No. 10/606,964 is a Continuation of application PCT/JP01/11552 filed on Dec. 27, 2001. PCT/JP01/11552 claims priority for application 2000-400737 filed on Dec. 28, 2000 in Japan.

BACKGROUND

1. Field of the Invention

The present invention relates to an amplifier circuit for AM broadcasting, and more particularly, to one preferably applicable to an RF (Radio Frequency) amplifier used for a broadcast signal input stage of a radio receiver that receives AM broadcast signals, etc.

2. Description of the Related Art

FIG. 1 shows a configuration of a conventional AM broadcasting reception circuit. FIG. 1A shows a configuration of a tuning circuit format and FIG. 1B shows a configuration of a non-tuning circuit format. As shown in FIG. 1A, the conventional AM broadcasting reception circuit in the tuning circuit format is constructed of a capacitor 101, a resistor 102, an FET (Field Effect Transistor) for signal amplification 103, a tuning circuit 104 and an IC 106. Of these elements, the capacitor 101, resistor 102, FET for signal amplification 103 and tuning circuit 104 constitute an RF amplifier.

Here, the capacitor 101 is intended to cut a DC component of an AM broadcast signal inputted from an antenna which is not shown and the resistor 102 is intended to give an appropriate bias to the FET for signal amplification 103. The FET 103 for signal amplification is intended to amplify the inputted AM broadcast signal and is constructed of a junction FET (junction field effect transistor=JFET).

The tuning circuit 104 is intended to amplify an RF signal outputted from the FET for signal amplification 103 at a high frequency and output it to the IC 106 and constructed of a tuning capacitor C1 and tuning coils L1 and L2. One end of this tuning circuit 104 is connected to a power supply Vcc. On the other hand, the IC 106 is intended to input the RF amplified signal outputted from the tuning circuit 104 and perform subsequent signal processing necessary for AM broadcasting reception such as mixing and frequency conversion.

Furthermore, as shown in FIG. 1B, the AM broadcasting reception circuit in the non-tuning circuit format is constructed of a capacitor 101, a resistor 102, an FET for signal amplification 103, a coupling capacitor 105, an IC 106 and a coil 107. Of these elements, the capacitor 101, resistor 102, FET for signal amplification 103, coupling capacitor 105 and coil 107 constitute an RF amplifier.

The scale of integration of an RF circuit for a wireless terminal which handles high frequency signals of 2.4 GHz band or 5 GHz band, etc., is being increased in recent years and an LSI which incorporates an RF circuit which has been mounted outside a chip as an individual analog part so far on a single chip using a CMOS technology is under development. Likewise, an LSI incorporating an RF circuit using a CMOS technology for an FM broadcasting receiver using frequency bands of 76 M to 90 MHz is also under development. These RF circuits integrated on a single chip also include RF amplifiers.

On the other hand, as shown in FIG. 1, an AM broadcasting receiver uses a junction (bipolar) type JFET 103 for the RF amplifier and its manufacturing process is different from the CMOS technology, and therefore the AM broadcasting RF amplifier is still mounted outside the chip of the IC 106 as a separate component. This is because influences of flicker noise (1/f noise) produced inside a MOS semiconductor are taken into consideration.

That is, the noise level of flicker noise is inversely proportional to frequency, and therefore in the case of a wireless terminal handling a high frequency signal, almost no flicker noise is produced even if its RF amplifier is constructed of a CMOS circuit. However, in the case of an AM broadcasting receiver handling low frequency signals of medium frequency such as 530 to 1710 KHz or low frequency such as 153 to 279 KHz, their frequency bands still belong to areas with large flicker noise components, and therefore it is not desirable to construct an RF amplifier with a CMOS circuit.

For this reason, the JFET 103 has been conventionally used for the RF amplifier. Moreover, an RF amplifier constructed of the JFET 103 combined with a bipolar transistor has also been used. However, these conventional technologies are unable to integrate an RF amplifier together with another RF circuit, etc., on a single chip, and as a result, the conventional technologies have a problem that it is not possible to reduce the size of an entire circuit as in the case of a high frequency wireless terminal.

The present invention has been implemented to solve these problems and it is an object of the present invention to integrate an RF amplifier for AM broadcasting together with other circuits on one chip while suppressing the flicker noise to a lowest possible level and thereby realize small size and low noise of the entire circuit.

BRIEF SUMMARY

The amplifier circuit for AM broadcasting according to the present invention is an amplifier circuit for AM broadcasting for amplifying an inputted AM broadcast signal by FETs and outputting it, characterized in that the FETs are constructed of P-channel MOSFETs.

In another mode of the present invention, the P-channel MOSFETs are characterized by including a first P-channel MOSFET for amplifying the inputted AM broadcast signal and a second P-channel MOSFET for carrying out AGC control on the signal outputted from the first P-channel MOSFET.

A further mode of the present invention is characterized by including a first P-channel MOSFET for amplifying the inputted AM broadcast signal, a second P-channel MOSFET for carrying out AGC control on the signal outputted from the first P-channel MOSFET and a tuning circuit for high-frequency amplifying a signal outputted from the second P-channel MOSFET and outputting it.

A still further mode of the present invention is characterized by including a capacitor for cutting a DC component of an inputted AM broadcast signal, a first P-channel MOSFET for amplifying the AM broadcast signal outputted from the capacitor, a resistor for giving an appropriate bias to the first P-channel MOSFET, a second P-channel MOSFET for carrying out AGC control on the signal outputted from the first P-channel MOSFET and a tuning circuit for high-frequency amplifying the signal outputted from the second P-channel MOSFET and outputting it.

A still further mode of the present invention is characterized in that the first P-channel MOSFET and the second P-channel MOSFET are cascode-coupled.

A still further mode of the present invention is characterized in that the area of the P-channel MOSFET is larger than a predetermined value.

According to the present invention configured as shown above, an RF amplifier for AM broadcasting is constructed even in a low frequency area using P-channel MOSFETs which involves smaller flicker noise than N-channel MOSFETs, making it possible to integrate more circuits including the RF amplifier for AM broadcasting on one chip with a MOS structure while suppressing the flicker noise to a lowest possible level and thereby realize small size and low noise of the circuits.

Furthermore, according to another feature of the present invention, the channel area of P-channel MOSFETs is increased, which suppresses the flicker noise to a further smaller level.

DETAILED DESCRIPTION

With reference now to the attached drawings, an embodiment of the present invention will be explained below.

Figure 1:
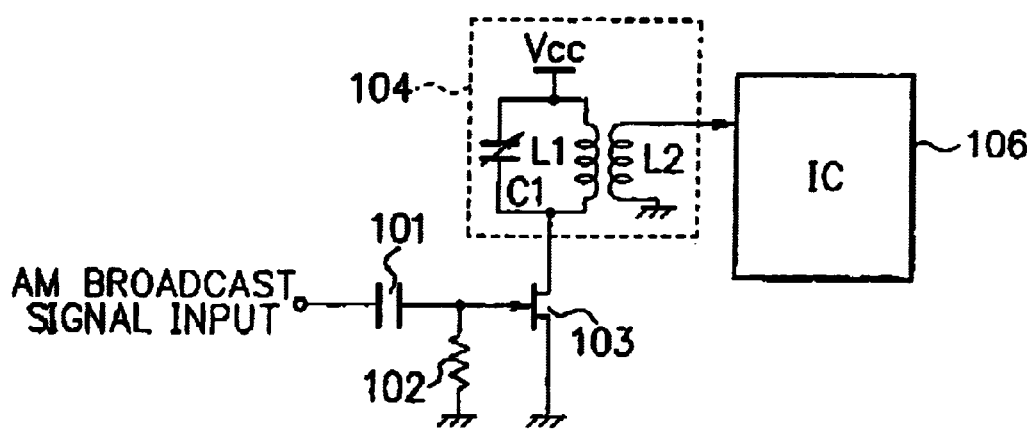
FIGS. 1A and 1B show a configuration of a conventional AM broadcasting reception circuit.
Figure 1:
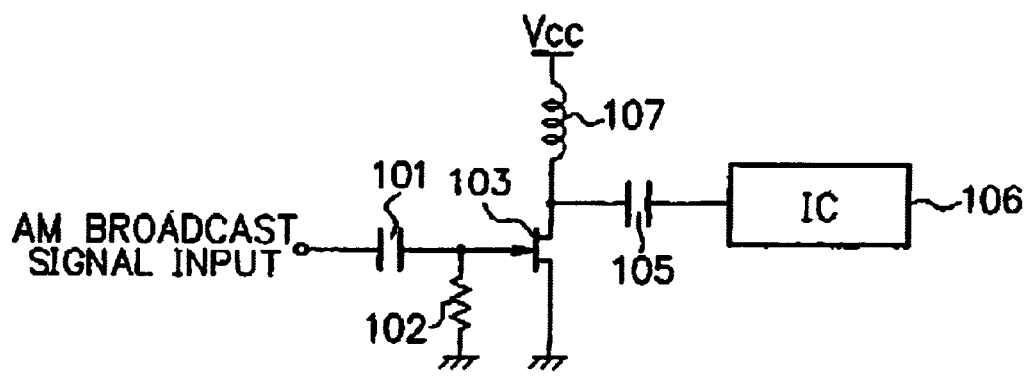
Figure 2:
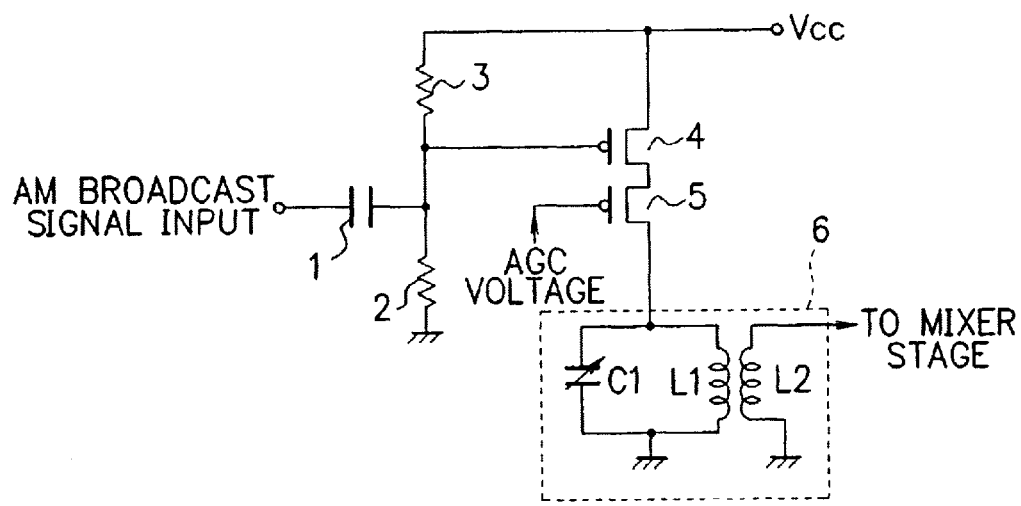
FIG. 2 shows a configuration example of an amplifier circuit for AM broadcasting according to this embodiment.

FIG. 2 shows a configuration of an amplifier circuit for AM broadcasting according to this embodiment. As shown in FIG. 2, the amplifier circuit for AM broadcasting of this embodiment is constructed of a capacitor 1, resistors 2 and 3, a first P-channel MOSFET 4, a second P-channel MOSFET 5 and a tuning circuit 6.

Here, the capacitor 1 is intended to cut a DC component of an AM broadcast signal inputted from an antenna which is not shown. The resistors 2 and 3 are intended to give an appropriate bias to the first P-MOSFET 4, connected in series between a power supply Vcc and ground and the capacitor 1 is connected at an intermediate node thereof.

The first P-MOSFET 4 is intended to amplify the AM broadcast signal outputted from the capacitor 1. Its gate is connected to the capacitor 1 at the intermediate node between the resistors 2 and 3, its source is connected to the power supply Vcc and its drain is connected to the source of the second P-MOSFET 5.

The second P-MOSFET 5 is intended to carry out AGC (Auto Gain Control) control on the RF signal outputted from the first P-MOSFET 4. Its gate is connected to a power supply for the AGC voltage, its source is connected to the drain of the first P-MOSFET 4 and its drain is connected to the tuning circuit 6. By the way, the power supply connected to the gate of the second P-MOSFET 5 need not necessarily be the power supply for the AGC voltage, but may also be a power supply with a fixed voltage.

The tuning circuit 6 is intended to amplify the AGC-controlled RF signal outputted from the second P-MOSFET 5 at a high frequency and output it and is constructed of a tuning capacitor C1 and tuning coils L1 and L2. One end of this tuning circuit 6 is connected to the drain of the second P-MOSFET 5 and the other end is grounded.

The amplifier circuit for AM broadcasting in the above-described configuration of this embodiment is integrated on one chip together with subsequent circuits that perform signal processing necessary for AM broadcasting reception including mixing, frequency conversion, etc., and the output signal of the tuning circuit 6 is supplied to, for example, a mixer stage which is not shown.

Next, the operation of the amplifier circuit for AM broadcasting configured as shown above will be explained.

First, a DC component of an AM broadcast signal inputted from an antenna (not shown) is cut by the capacitor 1 and its output signal is amplified by the first P-MOSFET 4.

Then, the RF signal outputted from the first P-MOSFET 4 is AGC-controlled to a certain level by the second P-MOSFET 5 and outputted to the tuning circuit 6.

Thus, in this embodiment, the first P-MOSFET 4 for signal amplification and the second P-MOSFET 5 for AGC control are cascode-coupled and the AM broadcast signal is cascode-amplified. This can reduce inter-electrode capacitance and thereby drastically reduce feedback from the output to the input, which provides an excellent high frequency characteristic. Furthermore, this cascode-coupling is suitable for AGC control and can increase stability of the circuits.

Furthermore, the tuning circuit 6 amplifies the RF signal at a certain level outputted from the second P-MOSFET 5 at a high frequency and outputs it to the next mixer which is not shown. The subsequent signal processing circuits (not shown) including a mixer and frequency conversion section carry out remaining processing necessary for AM broadcasting reception, tune for the input signal, and the output stage performs amplification and detection, etc., and outputs a speech signal.

Figure 3:
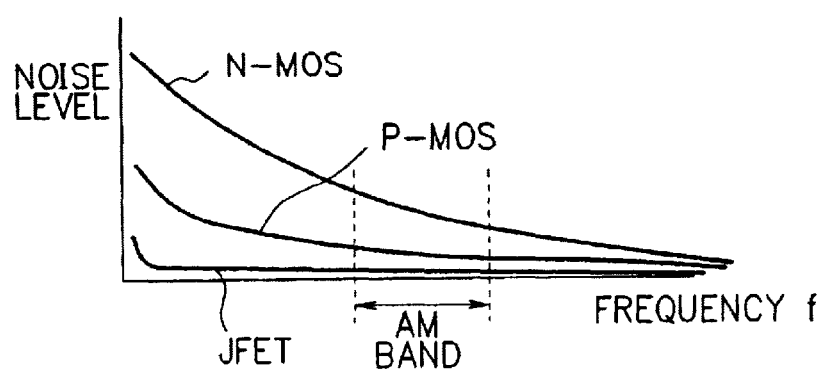
FIG. 3 shows a flicker noise characteristic.

FIG. 3 shows flicker noise characteristics of the P-MOSFET and other MOSFETs used for the amplifier circuit for AM broadcasting of this embodiment.

As shown in FIG. 3, the level of the flicker noise, which is internal noise of the MOS semiconductor, increases in inverse proportion to the frequency. Therefore, when the signal handled is a low frequency signal such as AM broadcast signal, constructing the RF amplifier with a MOS circuit increases the noise level compared to when JFET is used.

However, when an N-MOSFET is compared with a P-MOSFET, the noise level of the P-MOSFET is lower than that of the N-MOSFET even in a low frequency area. This embodiment constructs the FETs 4 and 5 for signal amplification and AGC control with only P-MOSFETs which are neither N-MOS nor CMOS, and can thereby suppress the flicker noise to a relatively low level.

On top of it, P-MOS technology and CMOS technology have the same manufacturing process, and can thereby integrate the entire RF circuit for AM broadcasting including the amplification circuit of this embodiment on one chip and reduce the size of the entire circuit. Furthermore, the ability to manufacture the entire RF circuit through the same MOS process can simplify the manufacturing process and reduce manufacturing costs. Of course, not only the RF circuit but also the subsequent baseband circuit, etc., can be integrated on one chip.

Next, the idea for further reducing flicker noise will be explained below. With the first and second P-MOSFETs 4 and 5, increasing the area of the channel through which a current (or carrier) flows can further suppress flicker noise.

In this case, it is possible to increase either one of the channel width or channel length of the FET, but it is preferable to increase both. When an RF amplifier of a wireless terminal which handles high frequency signals is constructed with a CMOS circuit, MOSFETs with a channel width and channel length of approximately 0.7 μm×1.5 μm, 0.6 μm×1.4 μm or 0.2 μm×1.0 μm are currently used. As the RF amplifier for AM broadcasting of this embodiment, it is preferable to use P-MOSFETs 4 and 5 having a larger channel area than this. For example, the channel width can be set to 1000 μm and the channel length can be set to 2 μm.

By the way, the above-described embodiment is not more than a specific example in implementing the present invention and this should not be interpreted as restricting the technological scope of the present invention. That is, the invention may be embodied in other specific forms without departing from the spirit or essential characteristic thereof. For example, the present invention is applicable not only to a tuning circuit format but also to a non-tuning circuit format.

INDUSTRIAL APPLICABILITY

The present invention is useful to realize small size and low noise of the entire circuit by integrating an RF amplifier for AM broadcasting together with other circuits on one chip while suppressing flicker noise to a lowest possible level.

What is claimed is:

1. An amplifier circuit suitable for amplifying an am broadcast signal, the circuit comprising:

FET means for amplifying the AM broadcast signal and reducing a flicker noise level in the amplifier below an N-MOS transistor equivalent flicker noise; and a tuning circuit operatively connected between the FET means and an output node of the amplifier circuit.

2. The amplifier circuit of claim 1, wherein said FET means comprises two cascode-coupled P-MOS transistors.

3. The amplifier circuit of claim 1, wherein said FET means comprises two cascode-coupled P-MOS transistors which receive, respectively, the AM broadcast signal and an AGC voltage.

4. The amplifier circuit of claim 1, further comprising a DC-blocking capacitor, wherein the AM broadcast signal is coupled through the DC-blocking capacitor to the FET means at a gate of a P-MOS transistor contained therein.

* * * * *